United States Patent [19]
Terk et al.

[11] Patent Number: 5,812,066
[45] Date of Patent: Sep. 22, 1998

[54] ANTENNA TUNING CONTROL CIRCUIT

[75] Inventors: Neil D. Terk, Laurel Hollow, N.Y.; John A. Lofgren, Glendale; William R. Steinike, Grafton, both of Wis.

[73] Assignee: Terk Technologies Corporation, Plainview, N.Y.

[21] Appl. No.: 515,544

[22] Filed: Aug. 16, 1995

[51] Int. Cl.$^6$ .............................. H04N 5/44; H04N 7/00; N04B 7/08
[52] U.S. Cl. .............................. 340/825.72; 340/825.72; 348/734; 348/142; 348/145; 348/146; 455/150.1
[58] Field of Search ..................... 340/825.72, 825.69; 348/731, 734; 359/142, 145, 146; 455/150.1, 151.1, 152.1

[56] References Cited

U.S. PATENT DOCUMENTS

| | | | |
|---|---|---|---|
| 3,909,726 | 9/1975 | Dobrovolny et al. | 325/357 |
| 4,564,843 | 1/1986 | Cooper | 343/745 |
| 4,916,532 | 4/1990 | Streck et al. | 358/83 |
| 4,959,720 | 9/1990 | Duffield et al. | 358/191.1 |
| 5,187,488 | 2/1993 | Van Der Vis | 343/747 |
| 5,201,072 | 4/1993 | Kobayashi | 455/277.1 |
| 5,263,183 | 11/1993 | Owen | 455/193.1 |
| 5,300,935 | 4/1994 | Yu | 342/359 |
| 5,323,240 | 6/1994 | Amano et al. | 348/731 |
| 5,386,251 | 1/1995 | Movshovich | 348/734 |
| 5,585,866 | 12/1996 | Miller et al. | 348/731 |

*Primary Examiner*—Michael Horabik
*Assistant Examiner*—Yonel Beaulieu
*Attorney, Agent, or Firm*—R. Neil Sudol; Henry D. Coleman

[57] ABSTRACT

A device for optimizing antenna operation, a wireless control signal detector detects a wireless control signal generated by a remote control unit, and a microprocessor is operatively connected to the detector. The microprocessor is programmed to analyze the wireless control signal during a learning operation to determine a coding format of the wireless control signal and to analyze the wireless control signal during a normal use operation to determine a broadcast channel or station selected by a user. The device additionally comprises a plurality of tuning elements operatively connectable to an antenna for tuning the antenna, and a plurality of switching circuits operatively connected to the tuning elements and to the microprocessor. The switching circuits are operable to selectively couple the tuning elements to the antenna, in response to signals from the microprocessor, thereby optimizing signal reception by the antenna for a channel or station selection encoded in the wireless control signal.

23 Claims, 9 Drawing Sheets

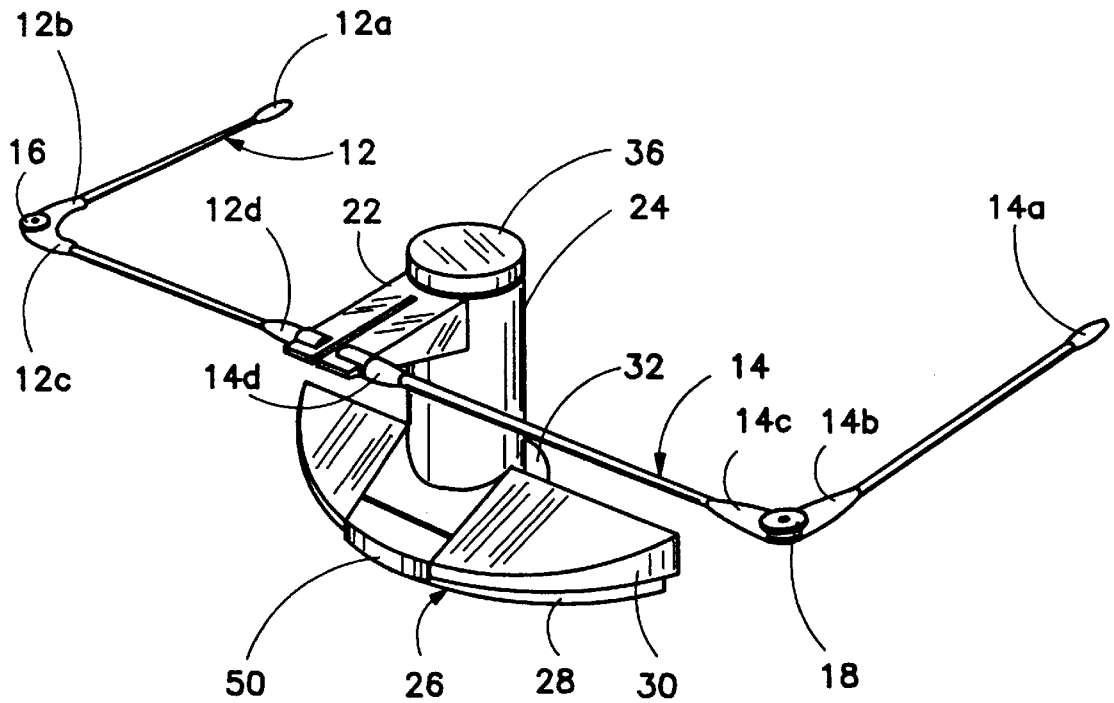
PRIOR ART FIG. 1
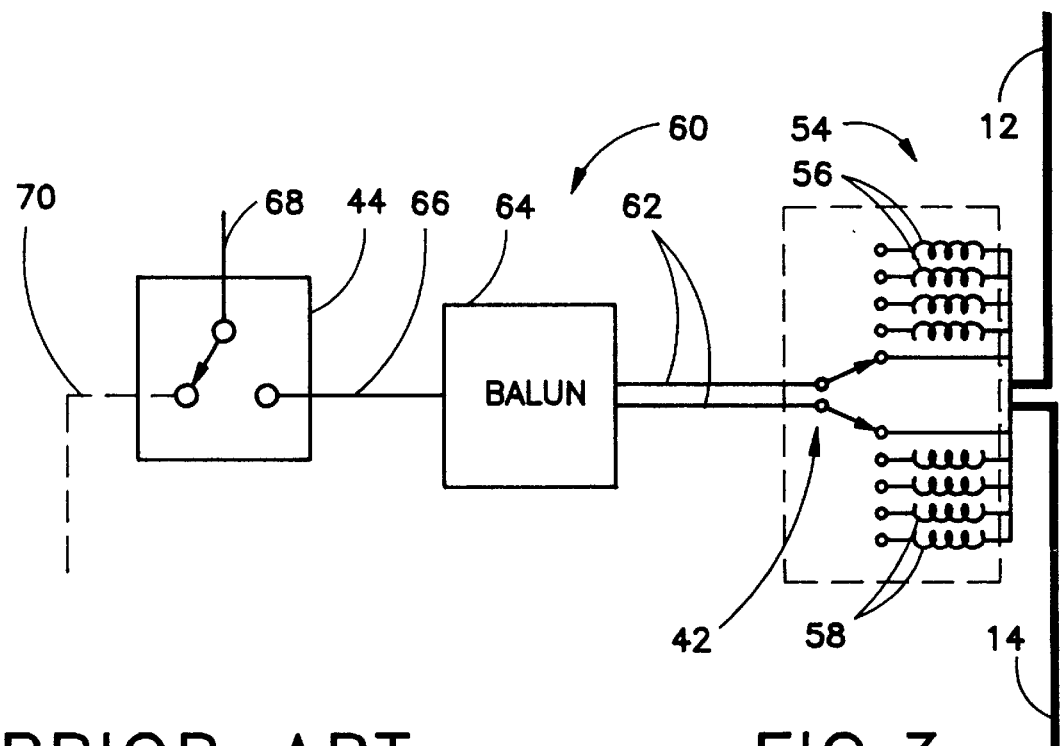
PRIOR ART FIG. 3

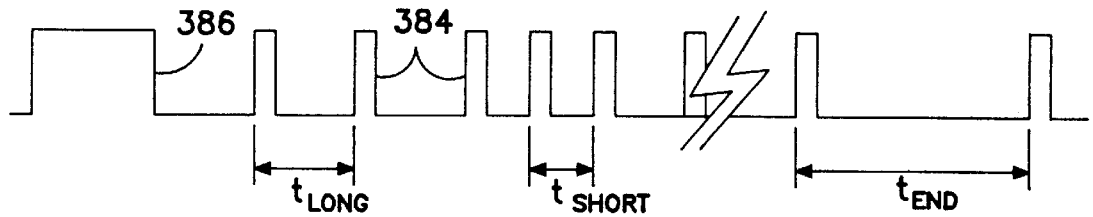
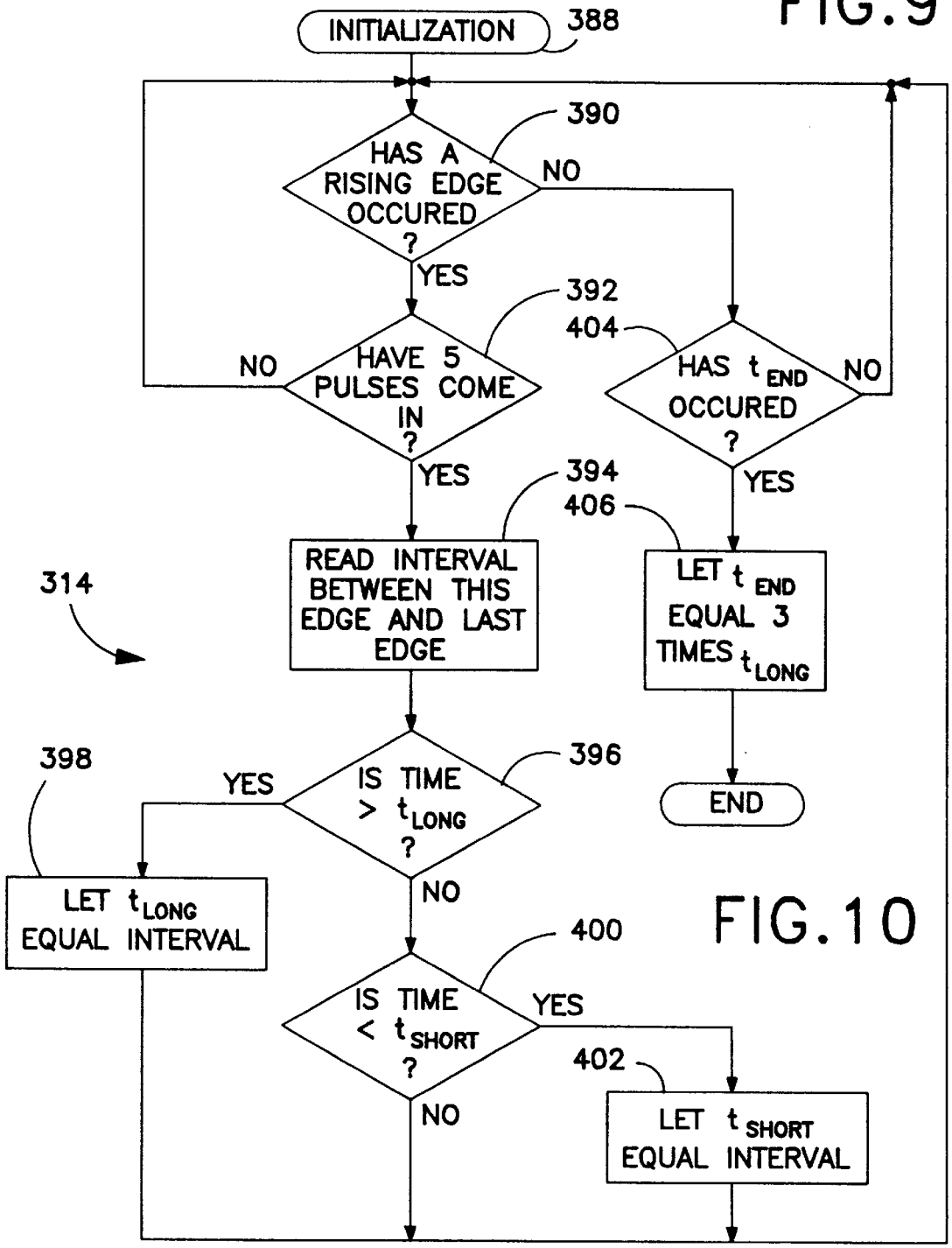
FIG. 9
FIG. 10

ANTENNA TUNING CONTROL CIRCUIT

BACKGROUND OF THE INVENTION

1. Field of the Invention

This invention relates to a circuit for controlling the tuning of an antenna. More particularly, this invention relates to a circuit for facilitating antenna operation where a plurality of antenna tuning elements are provided for optimizing impedance matching over a plurality of different frequency ranges. This invention also relates to an associated method for optimizing reception of a desired broadcasting station or channel.

2. Description of Prior Art

Conventional television antennas for receiving commercial television broadcasts are difficult to design inasmuch as such antennas must satisfy or balance among many inharmonious engineering requirements. A basic problem in attempting a set-top design that receives all VHF and UHF broadcast channels efficiently is that an antenna with an electrical extent large enough to facilitate impedance matching at each of the lowest frequency channels, particularly Channels 2 and 3, has such a large electrical extent at the highest frequency channels that the radiation patterns can exhibit sizeable frequency variations, leading to amplitude and/or phase weightings of a received broadcast signal over its frequency band and substantially diminished quality of reception.

One solution in dipole antennas sized for set-top installation is to provide individual channel matching circuits to increase the amount of broadcast signal delivered to the receiver. For the highest numbered channels only, the problems in antenna design are less severe. Because bandwidth in those channels is less than one percent and wavelength is less than 14 inches, antennas sized for set-top installation can exhibit inherently satisfactory impedance properties over a frequency range encompassing many channels, often the entire UHF broadcast band.

A basic problem in set-top antenna design arising from inharmonious engineering requirements is that the antenna's electrical extent is generally too little in one band and too large in another. Because of the large wavelengths and appreciable percentage bandwidths required in the lowest frequency channels (2 and 3), efficient reception in these channels, which depends on the antenna's size in wavelengths, conflicts with its height, its width and the length of its dipole arms. The superposition of an antenna configuration that can perform well at Channel 2 with one that can perform well at Channels 3 and 4, etc. and can be easily reconfigured for efficient operation at any channel is a demanding requirement.

In one recently proposed solution to the problem of TV-set-top antenna design, a television antenna device comprises a pair of electrically conductive dipole arms, a support attached to the dipole arms for supporting the dipole arms, and an electrical circuit operatively connected to each of the dipole arms and mounted to the support for tuning the dipole arms for an optimal impedance match over a plurality of different frequency ranges. A switch is operatively connected to the electrical circuit and is mounted to the support for enabling adjustment of a circuit configuration including the electrical circuit and the dipole arms to selectively tune the dipole arms for an optimal impedance match over the plurality of different frequency ranges.

The antenna device of this recent solution further comprises coupling componentry for coupling the dipole arms to a television receiver via the electrical circuit. That circuit includes a plurality of paired first and second inductors, where the first and second inductors of each pair of inductors have a common inductance and where the inductors of each pair differ in inductance from the inductors of other pairs. The switch includes means for selectively connecting the dipole arms to the coupling componentry via alternate pairs of the first and second inductors so that the first inductor of a pair is operatively connected in one circuit configuration to one of the dipole arms and the associated second inductor is operatively connected in another circuit configuration to the other of the dipole arms.

In the recently proposed antenna device, all of the first inductors are connected to a common terminal at the dipole side of the inductors and all of the second inductors are similarly connected to a common terminal, and thence to one another, on the dipole side.

It is contemplated in the afore-described recent design that the coupling componentry includes a balun transformer and a balanced two-wire transmission line connected at one end to the switch and at an opposite end to the balun transformer. In addition, an unbalanced coaxial transmission line extends from the balun transformer, while a connector is provided at one end of the unbalanced coaxial transmission line for operatively linking the unbalanced coaxial transmission line to the television receiver. In this configuration, the balun transformer is preferably a ferrite component with an impedance ratio of 1:1.

OBJECTS OF THE INVENTION

An object of the present invention is to provide a circuit for facilitating operation of an antenna where a plurality of tuning elements are provided, as described above, for selectively tuning the antenna for an optimal impedance match over a plurality of different frequency ranges.

Another object of the present invention is to provide a method for facilitating optimal reception of a desired broadcasting station or channel by an antenna.

A further object of the present invention is to provide a circuit for enabling remote control of an antenna to optimize reception thereby in accordance with a desired channel or station selection by a remote control unit.

A more particular object of the present invention is to provide such a circuit which can be used with a variety of remote control units.

These and other objects of the present invention will be apparent from the drawings and detailed descriptions herein.

SUMMARY OF THE INVENTION

A device for optimizing antenna operation comprises, in accordance with the present invention, a wireless control signal detector for detecting a wireless control signal generated by a remote control unit, and a microprocessor operatively connected to the detector. The microprocessor is programmed to analyze the wireless control signal during a learning operation to determine a coding format of the wireless control signal and to analyze the wireless control signal during a normal use operation to determine a broadcast channel or station selected by a user. The device additionally comprises a plurality of tuning elements operatively connectable to an antenna for tuning the antenna, and a plurality of switching circuits operatively connected to the tuning elements and to the microprocessor. The switching circuits are operable to selectively couple the tuning elements to the antenna, in response to signals from the microprocessor, thereby optimizing signal reception by the antenna for a channel or station selection encoded in the wireless control signal.

The switching circuits may each include a transistor driving a diode switch connected in series to a respective one of the tuning elements. In that event, the microprocessor is connected at outputs to the respectives transistors of the switching circuits.

The device may further comprise a display operatively connected to the microprocessor for displaying a designation of the channel or station selection in response to signals from the microprocessor.

Where the microprocessor has a plurality of terminals, the device further comprises filter elements operatively connected to those terminals for reducing electromagnetic interference generated by the microprocessor.

A device for optimizing antenna operation comprises, in accordance with another conceptualization of the present invention, (a) a detector for sensing a wireless control signal generated by a remote control unit and (b) a processor operatively connected to the detector for analyzing the wireless control signal during a learning operation to determine a coding format of the wireless control signal and for analyzing the wireless control signal during a normal use operation to determine a broadcast channel or station selected by a user. The device further comprises tuning elements operatively connectable to an antenna for tuning the antenna and a control component operatively connected to the processor and to the tuning elements for controlling the tuning elements, in response to signals from the processor, to modify or select the tuning elements depending on a channel or station selection encoded in the wireless control signal.

The tuning elements may include pairs of first and second inductors, the first and the second inductors of each pair of inductors having a common inductance, the inductors of each pair differing in inductance from the inductors of other pairs. All of the first inductors are connected on one side to one another and all of the second inductors are similarly connected on one side to one another, and the control component includes a plurality of switching circuits operatively connected to the processor and to respective ones of the first and the second inductors.

As discussed above, the switching circuits may each include a transistor driving a diode switch connected in series to a respective one of the first and the second inductors, the processor being connected at outputs to the respective transistors of the switching circuits. A display may be operatively connected to the processor for displaying a designation of the channel or station selection in response to signals from the processor. Inductors and/or other filter type elements may be operatively coupled to the terminals of the processor for reducing electromagnetic interference generated by the processor.

According to another feature of the present invention, a conductive metal housing substantially surrounds the processor for shielding the dipole arms and the television receiver from electromagnetic interference generated by the processor.

A device for optimizing antenna operation comprises, in accordance with yet another conceptualization of the present invention, a wireless control signal detector, a processor operatively connected to the detector for analyzing the wireless control signal to determine a broadcast channel or station selected by a user, and a plurality of tuning elements operatively connectable to an antenna for tuning the antenna. A plurality of switching circuits are operatively connected to the tuning elements and to the processor for selectively coupling the tuning elements to the antenna, in response to signals from the processor, thereby optimizing signal reception by the antenna for a channel or station selection encoded in a wireless control signal sensed by the detector.

According to an additional feature of the present invention, the antenna optimization device further comprises a switch or other input connected to the processor for inducing the processor to analyze the wireless control signal during a learning operation to determine a coding format of the wireless control signal.

A method for facilitating optimal reception of a desired broadcasting station or channel, in accordance with the present invention, utilizes a receiver, a wireless remote control unit, an antenna connected to the receiver, and tuning elements connectable to the antenna for tuning the antenna for an optimal impedance match over a plurality of different frequency ranges. The method comprises operating the wireless remote control unit to generate a wireless control signal, and, in response to the generation of the wireless control signal, automatically operating the receiver to tune the receiver to a selected channel or station encoded by the wireless control signal. In further response to the generation of the wireless control signal, the tuning elements are automatically and selectively coupled to the antenna to optimize an impedance match over a frequency range corresponding to the selected channel or station.

The method may additionally comprise operating a microprocessor to determine a coding format of the wireless control signal, reducing electromagnetic interference generated by the microprocessor, selectively coupling the tuning elements to the antenna by selectively activating transistor switching circuits, and/or automatically displaying a designation of a channel or station to which the antenna is tuned.

A method for deciphering a format code of a wireless control signal for remotely operating an electronic consumer device comprises, in accordance with the present invention, (i) automatically sensing a first wireless remote control signal generated by a user-operated remote control unit, the signal having pulses separated by variable intervals, (ii) automatically analyzing the signal to determine a maximum interval length between successive pulses and a minimum interval length between successive pulses, (iii) automatically computing an arithmetic average of the maximum interval length and the minimum interval length, (iv) automatically detecting the second wireless control signal, (v) automatically analyzing the second wireless control signal to determine lengths of interpulse intervals in the second wireless control signal, and (vi) for each detected interpulse interval of the second wireless control signal, automatically comparing the determined interval length with the average. In the event that a given detected interpulse interval of the second wireless control signal has a length greater than the average, that given detected interpulse interval is automatically recorded as being a long interval. In the event that any selected detected interpulse interval of the second wireless control signal is less than the average, that selected detected interpulse interval is automatically recorded as being a short interval.

In accordance with another feature of the present invention, the automatically analyzing of the first wireless remote control signal to determine a maximum interval length between successive pulses and a minimum interval length between successive pulses includes (1) setting an initial maximum interval length equal to zero and an initial minimum interval length equal to infinity, (2) automatically determining lengths of interpulse intervals in the second wireless control signal, (3) for each detected interpulse interval of the first wireless control signal, automatically comparing the determined interval length with at least one of the initial maximum interval length and the initial minimum interval length, and (4) resetting a value of the one of the initial maximum interval length and the initial minimum interval length.

The present invention provides a circuit for facilitating operation of an antenna where a plurality of tuning elements such as inductors are provided for selectively tuning the antenna for an optimal impedance match over a plurality of different frequency ranges.

A method in accordance with the present invention facilitates optimal reception of a desired broadcasting station or channel by an antenna, particularly including where the antenna is connected to a receiver which is operated by a remote control unit. A circuit in accordance with the present invention thus enables remote control of an antenna to optimize reception thereby in accordance with a desired channel or station selection by the remote control unit.

A circuit in accordance with the present invention can be used with a variety of remote control units. The circuit operates according to programming which enables it to automatically determine the coding format of the remote control unit.

BRIEF DESCRIPTION OF THE DRAWING

FIG. 1 is an isometric view of a set-top television dipole antenna in accordance with a prior art design.

FIG. 3 is basically a block diagram of electrical components of the television antenna of FIGS. 1 and 2.

FIG. 9 is a graph of voltage versus time, showing pulses of a wireless remote control signal and the interpulse time intervals thereof.

FIG. 10 is a flow chart diagram showing steps in a routine to learn a timing code or format of a remote control unit, in accordance with the present invention.

DETAILED DESCRIPTION

Figure 5:
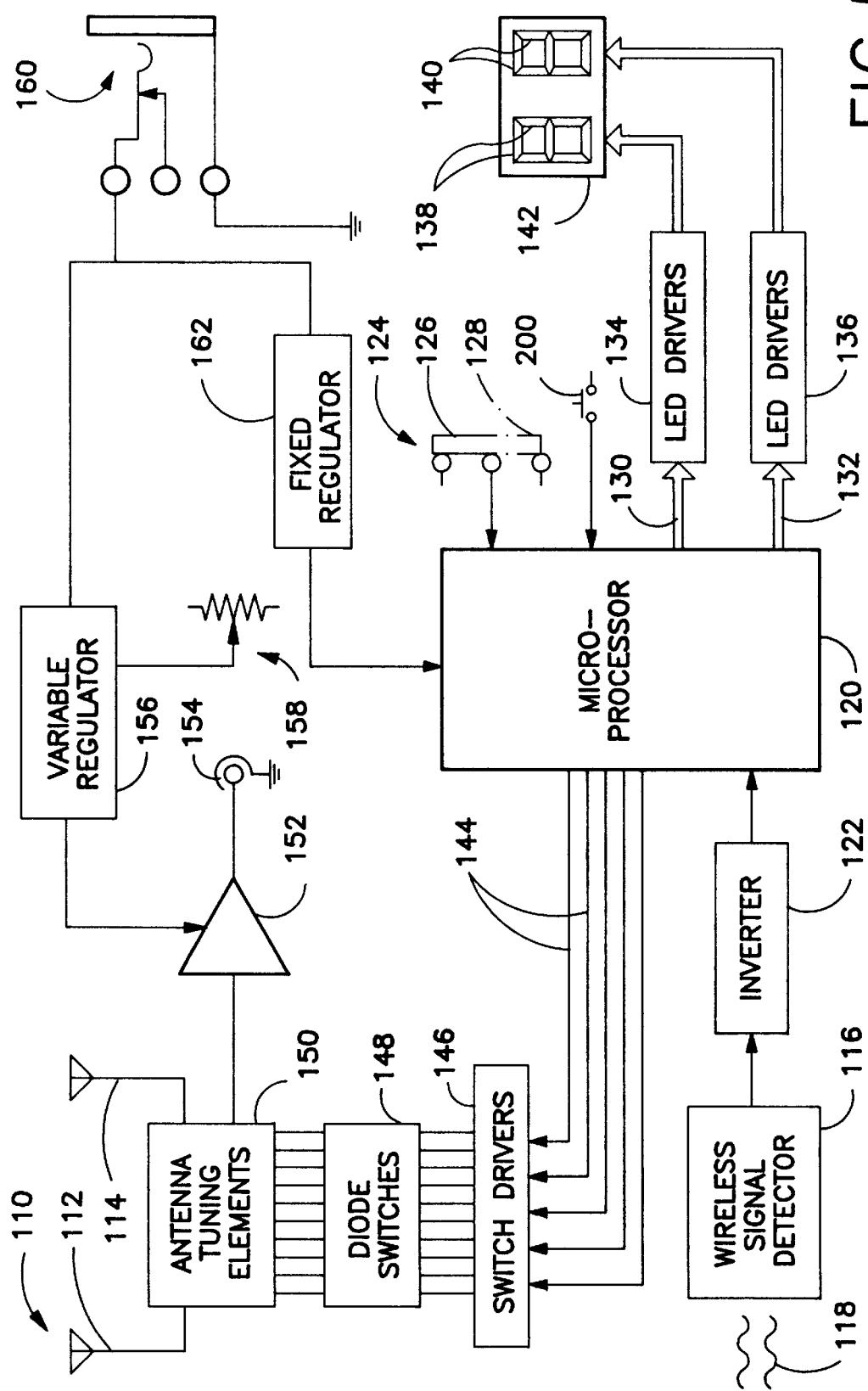
FIG. 5 is a block diagram of a circuit for controlling the tuning of an antenna where a plurality of tuning elements are provided, as described below with reference to FIGS. 1–4, for optimizing impedance matching over a plurality of different frequency ranges.
Figure 6:
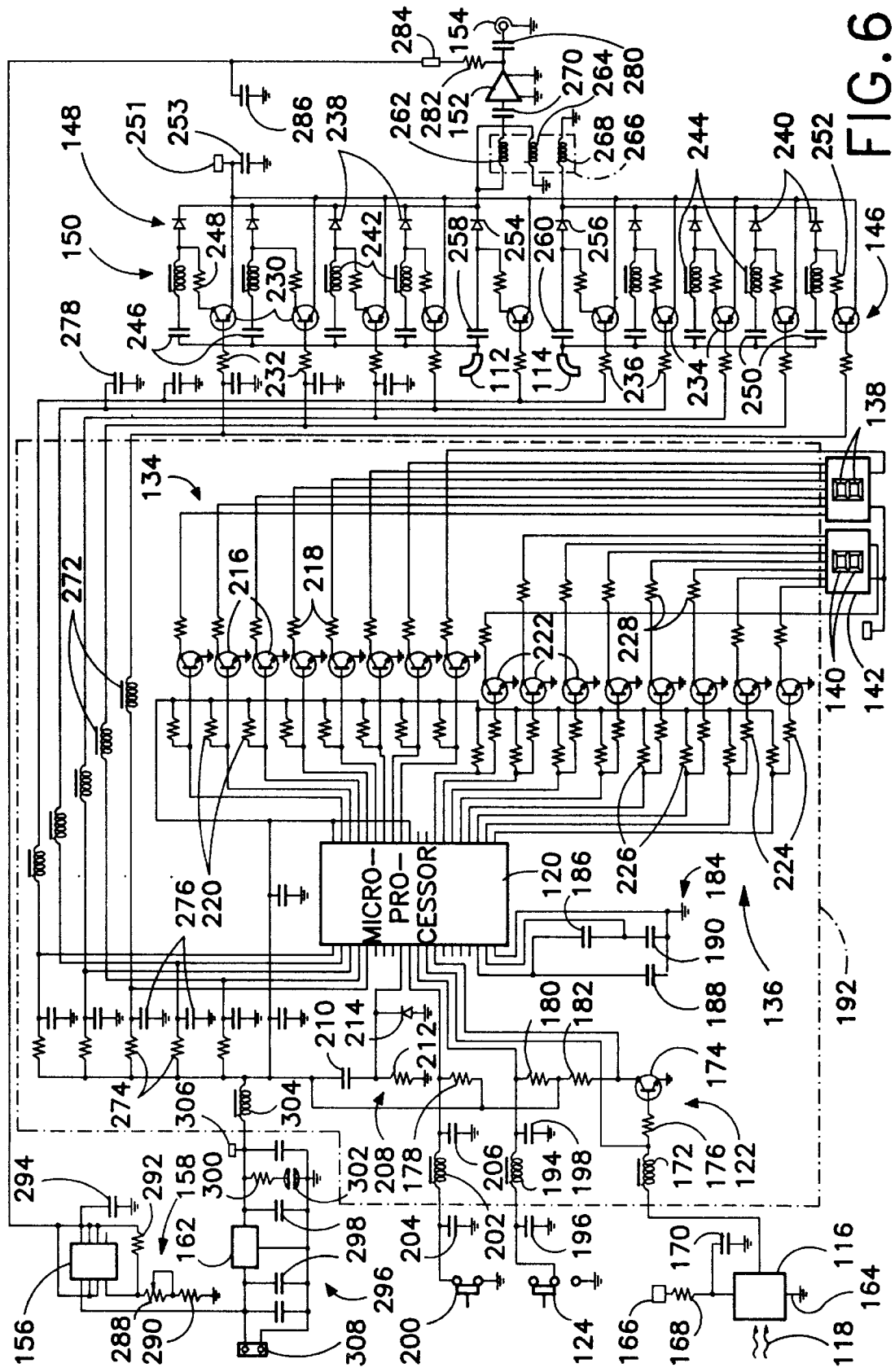
FIG. 6 is a circuit diagram depicting details of the circuit of FIG. 5.

FIGS. 1–4 of the drawing illustrate a prior art dipole television antenna with tuning elements in the form of matched inductor pairs for optimizing signal reception over a broad band of frequencies. FIGS. 5 and 6 illustrate a circuit for controlling the tuning of an antenna in response to a wireless signal from a hand-held remote control unit. More specifically, the circuit of FIGS. 5 and 6 controls tuning of a television dipole antenna which has inductor-type tuning elements for optimizing reception, as described below with reference to FIGS. 1–4.

Figure 2:
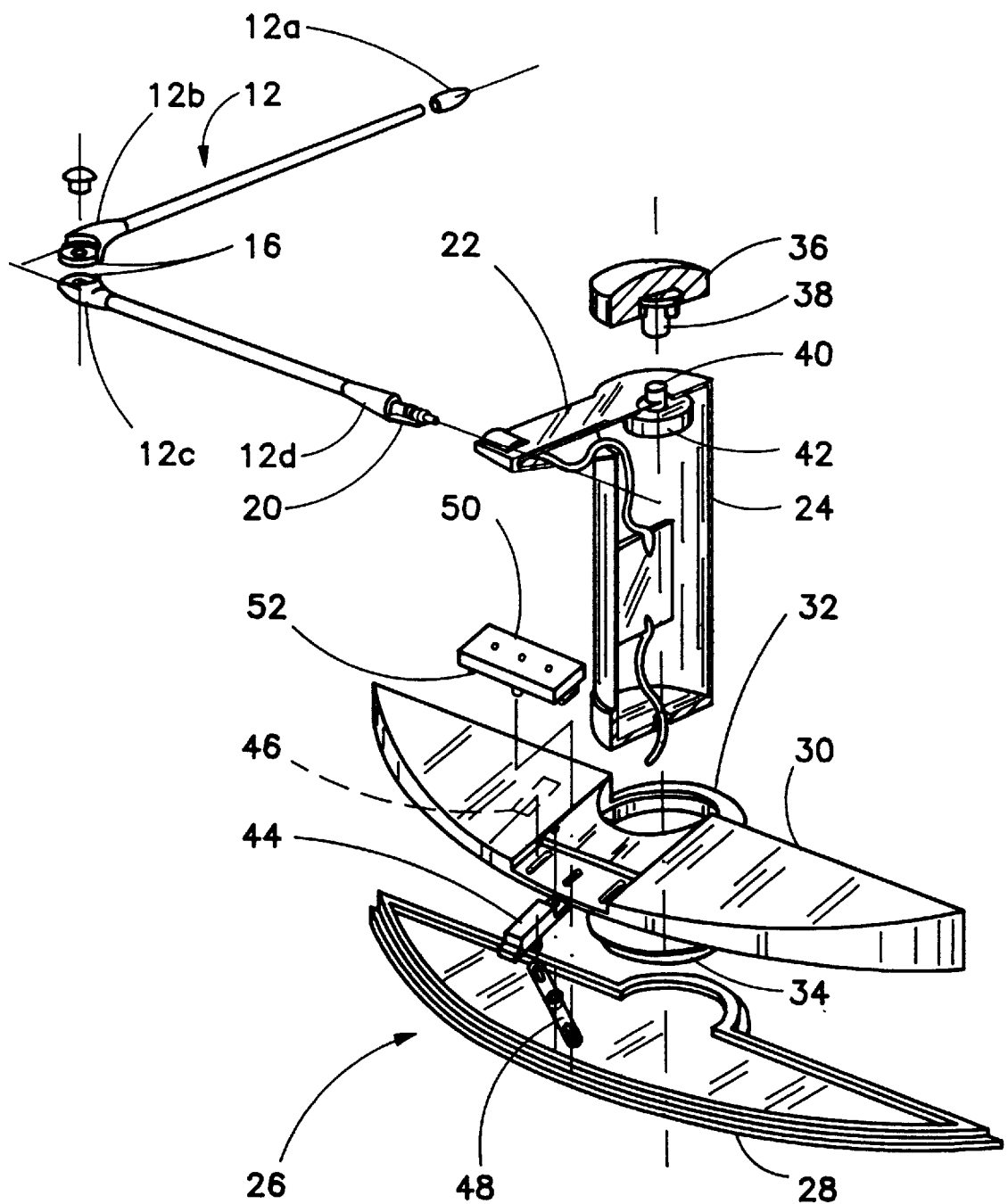
FIG. 2 is a partial exploded view of the set-top television dipole antenna of FIG. 1.

As illustrated in FIGS. 1 and 2, a set-top television antenna of the dipole type comprises a pair of electrically conductive dipole arms 12 and 14 each provided with a respective elbow type joint 16 and 18 for enabling a bending of the respective arm from a fully extended configuration to a completely folded back configuration. At an inner end, each dipole arm 12 and 14 is connected via a respective bayonnet type connector 20 (FIG. 2) to a horizontal or cantilevered bracket 22 at an upper end of a cylindrical or tubular vertical housing extension 24. Each dipole arm 12 and 14 is provided with a plurality of plastic molded end caps 12a, 12b, 12c, 12d and 14a, 14b, 14c, 14d.

Housing extension 24 is connected at a lower end to a wing shaped main housing 26 including a solid rubber molded base 28 and an upper shell or casing half 30 fitted thereto. Shell or casing half 30 is formed along a rear side with a ring 32 for receiving the lower end of tubular housing extension 24. As shown in FIG. 2, an additional ring 34 is provided for retaining tubular housing extension 24.

At its upper end, tubular housing extension 24 is provided with a rubber molded rotary tuning knob 36 having a plastic molded knob core 38 which mates with a projection 40 of a tuner or rotary switch 42 to enable manual operation of the tuner. Tuner 42 is disposed inside tubular housing extension 24 along the upper end thereof.

Main housing 26 holds a mechanical RF single-pole double-throw switch 44 which is attached at 46 to shell or casing half 30 along an underside thereof. A lever 48 operatively links switch 44 to a manually actuatable switch cap 50 which is slidably mounted to shell or casing half 30 via snap-in guide lugs 52.

As illustrated in FIG. 3, dipole arms 12 and 14 are operatively connected to an electrical circuit 54 disposed inside and mounted to tubular housing extension 24 for tuning dipole arms 12 and 14 for an optimal impedance match over a plurality of different frequency ranges. Tuner or rotary switch 42 includes or is operatively connected to electrical circuit 54 for enabling manual adjustment of a circuit configuration including electrical circuit 54 and dipole arms 12 and 14 to selectively tune dipole arms 12 and 14 for an optimal impedance match over the plurality of different frequency ranges.

More particularly, electrical circuit 54 includes a plurality of paired first inductors 56 and second inductors 58, one pair comprising two straight wires. First inductors 56 are connected on one side to one another in series with dipole arm 12, while second inductors 58 are connected on one side to one another in series with dipole arm 14. Each first inductor 56 is paired with a respective second inductor 58 having a common inductance which is different from the inductances of the other pairs of inductors 56 and 58. Inductors 56 and 58 preferably take the form of ferrite inductors.

The antenna device further comprises coupling componentry 60 for coupling dipole arms 12 and 14 to a television receiver. Coupling componentry 60 includes a balanced two-wire transmission line 62, a balun transformer 64, and an unbalanced coaxial transmission line 66. Two-wire transmission line 62 is connected at one end to tuner or rotary switch 42 and at an opposite end to balun transformer 64. Coaxial transmission line 66 extends from balun transformer 64 to switch 44.

Balun transformer 64 is a ferrite component with an impedance ratio of 1:1, as per the ARRL Antenna Handbook. Because transformer 64 is a ferrite device, its size can be diminished compared with designs using linear circuit elements which have dimensions which are an appreciable fraction of a wavelength (approximately 18 feet at Channel 2). The 1:1 ratio is used partly because it supports the largest possible bandwidth and partly because it matches the lower channel resistance levels—where the match is needed more—better than at the higher channels where it is less important.

As further illustrated in FIG. 3, switch 44 is connected to a television receiver (not shown) via a line 68 and to a video playback unit, a cable input or other auxiliary device (not shown) via another line 70. Switch 44 is operative to permit alternate connection of the television receiver to the antenna device or to the video playback unit. Isolation in switch 44 is important since cable signals can be very much larger than those received by the antenna. In installations where the broadcast signal must compete with very powerful cable signals, additional attenuations may be installed at the cable input.

Depending on the actuation of tuning knob 36, tuner or rotary switch 42 selectively connects dipole arms 12 and 14 to coupling componentry 60 via alternate pairs of inductors 56 and 58 so that the first inductor 56 of a pair is operatively connected in one circuit configuration to dipole arm 12 and the associated second inductor 58 is operatively connected in another circuit configuration to the other dipole arm 14.

Figure 4:
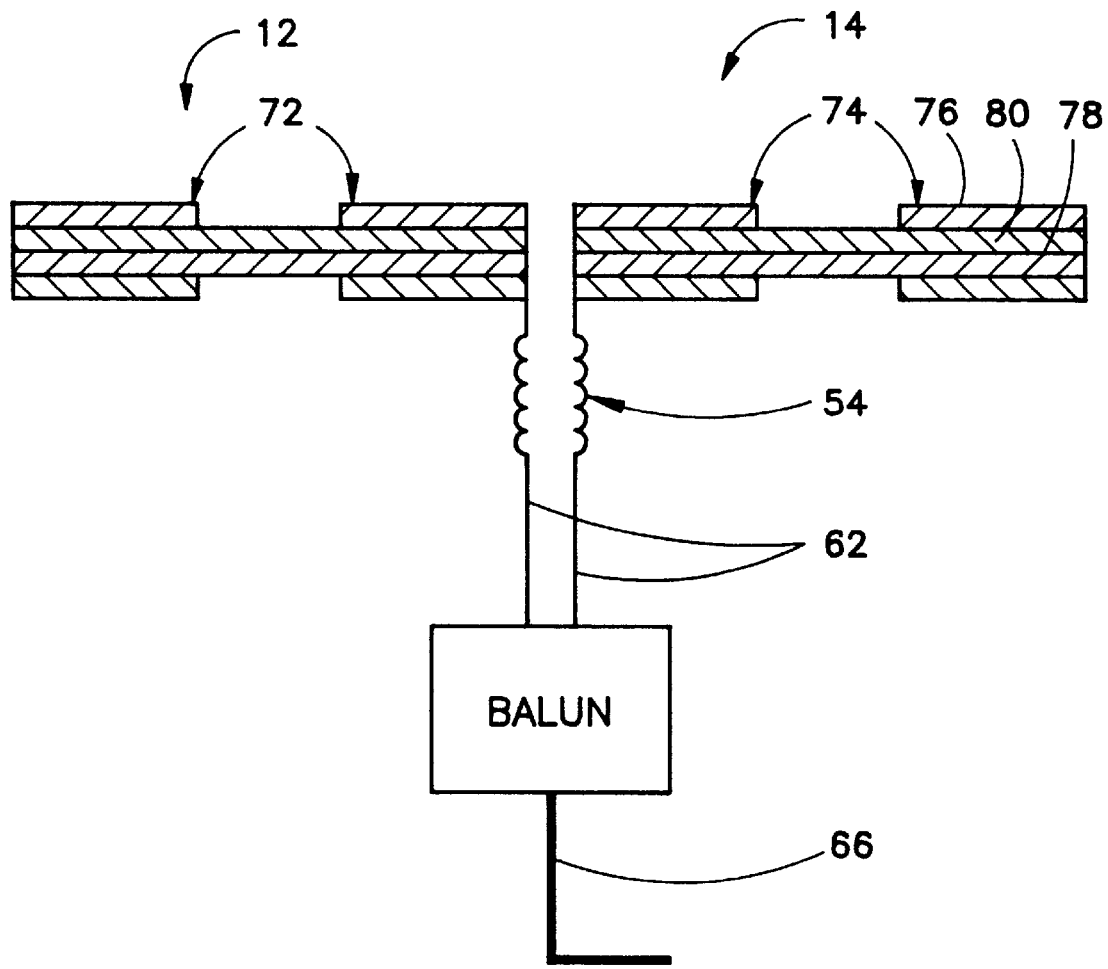
FIG. 4 is a schematic cross-sectional view of dipole arms of the antenna of FIGS. 1 and 2.

As illustrated in FIG. 4, dipole arms 12 and 14 each include a pair of coaxial series tuned circuits 72 and 74 for suppressing current flow over electromagnetic frequencies corresponding to higher VHF channels, particularly Channels 7–13. Each coaxial series tuned circuit 72 and 74 includes a cylindrical outer conductor 76, an inner conductor 78, and a cylindrical dielectric layer 80 between conductors 76 and 78. The individual circuits of each pair of coaxial series tuned circuits 72 and 74 are spaced by the elbow type joints 16 and 18, respectively. A set-top television antenna as described herein is a center-fed, bent arm dipole with provisions for adjusting the bends, which are located about halfway along each arm 12 and 14. Electrically, dipole arms 12 and 14 are coaxial cables with the outer jacket peeled away over a limited region about bendable elbow type joints 16 and 18. The internal coaxial circuits generated by this structure are terminated in short circuits at or near the cable ends, at plastic end caps 12*a* and 14*a*. Coaxial series tuned circuit pairs 72 and 74 are dispersive circuits tending to increase the effective electrical lengths of arms 12 and 14 at the lower frequencies by adding series inductance and to diminish their effective electrical length at the higher VHF frequencies by adding very large series impedances.

It is to be noted that only one or three or four coaxial series tuned circuits may be included along the length of each dipole arm 12 and 14. However, increasing the number of such circuits over two is not believed to perceptibly improve performance. It is to be further noted that over the large frequency range of UHF Channels 14–83, the series reactance added by series tuned circuits 72 and 74 varies rapidly from very large to very small and the radiation resistance, because of the relatively large extent of the antenna in wavelengths, is much larger than at the lowest channels. The antenna pattern is believed to be highly structured in angle with several azimuth nulls. However, the percentage bandwidth of any one channel is small enough that patterns will be reasonably stable over the frequency extent of any one.

As discussed above, tuner or rotary switch 42 is used to select among pairs of matched ferrite inductors 56 and 58. Those inductors 56 and 58 with the largest inductance values tune the antenna for a best possible impedance match, consistent with the small electrical size of the antenna, over the Channel 2 frequency range. Two other matched pairs of inductors 56 and 58 serve to optimize impedance matching for Channels 3 and 4, respectively. Another pair of inductors 56 and 58 is suitable for impedance matching for both Channels 5 and 6. Another pair of inductors 56 and 58 may be reserved for the FM frequency band. Inductors 56 and 58 of a final inductor pair are actually straight sections of conductor of nominally (almost) zero inductance. This smallest inductance serves to tune the antenna for an acceptable impedance match over the frequencies of Channels 7 to 83.

As illustrated in FIG. 5, a circuit for controlling the tuning of an antenna such as a television antenna 110 having a pair of dipole arms 112 and 114 comprises a detector 116 capable of sensing a wireless remote control signal 118 generated by a conventional hand-held remote control unit (not illustrated). In particular, detector 116 may take the form of an infrared sensor element.

The output signal of detector 116, which encodes or reproduces the information in the wireless remote control signal 118, is fed to an input of a microprocessor 120 via an inverter 122. Microprocessor 120 is programmed to analyze the wireless control signal, as relayed via detector 116 and inverter 122, during a learning operation to determine a coding format of the wireless control signal. Whether microprocessor 120 is operating in a learning mode or a normal operating mode is determined by the status of a single-pole, double-throw type switch 124. In one position 126 of switch 124, microprocessor 120 operates in the learning mode, while in another position 128 of switch 124, microprocessor 120 operates in the normal operating mode.

Generally, each hand-held remote control unit on the market uses one of several coding formats. During a learning operation, microprocessor 120 analyzes the timing characteristics of an incoming wireless remote control signal to determine which type of coding format a particular handheld remote control unit utilizes. This format is memorized by microprocessor 120 upon termination of the learning operation, i.e., upon a shifting of switch 124 from position 126 to position 128. During the learning mode of operation, microprocessor 120 also determines the wireless signal codes for digits 0 through 9 and the wireless signal codes for channel incrementation or decrementation.

During the normal operating mode of microprocessor 120, the microprocessor analyzes an incoming wireless control signal 118 to determine a broadcast channel or station selected by a user.

Microprocessor 120 has output leads 130 and 132 extending to respective LED drivers 134 and 136 which in turn are connected to respective LED segments 138 and 140 of a digital type display 142. Microprocessor 120 indicates on display 142 a current channel selection.

Microprocessor 120 is connected via output leads 144 to a bank of switch drivers 146 which in turn are coupled to a plurality of diode switches 148. Diode switches 148 are connected to a plurality of antenna tuning elements in the form of inductors 150 which are paired or matched as described above with reference particularly to FIG. 3. The conduction states of diode switches 148 determine which pair of matching inductors 150 are connected to antenna dipole arms 112 and 114 for purposes of tuning the dipole arms for an optimal impedance match over a frequency range corresponding to a selected television channel. The conduction states of diode switches 148 are determined by microprocessor 120 in accordance with the channel selection encoded in the wireless remote control signal 118 sensed by detector 116.

Upon the energization of selected switch drivers 146 by microprocessor 120, antenna dipole arms 112 and 114 are connected via selected matching pairs of inductors 150 to a preamplifier 152 which has a coaxial-cable output 154 connectable to a television receiver. Preamplifier 152 is powered via a variable voltage regulator 156 having a manually variable gain control 158. Regulator 156, as well as other circuit elements such as microprocessor 120, is energized by a d-c voltage generated from a power input 160 by a fixed voltage regulator 162.

FIG. 6 illustrates in detail the circuit elements comprising the functional blocks of FIG. 5. Infrared detector 116 has one input grounded at 164 and another input connected to a 5-volt source 166 via a resistor 168 and a capacitor 170. Detector 116 is connected to a first input of microprocessor 120 via an inductor 172 and to a second input of microprocessor 120 via inductor 172 and inverter 122. Inverter 122 includes a transistor 174 having a base connected to an output of detector 116 via inductor 172 and a resistor 176. A terminal of transistor/inverter 122 connected to microprocessor 120 is also connected to a plurality of pull-up resistors 178, 180, 182 for providing a high logic level to the microprocessor in the absence of a signal output from transistor/inverter 122.

Microprocessor 120 receives a clock signal from a time base 184 comprising a crystal 186 and a pair of capacitors 188 and 190. Microprocessor 120 internally divides the incoming clock signal, generating electromagnetic interference (EMI) in the process. A number of filtering components including inductor 172 are provided for blocking or at least reducing the amount of the electromagnetic interference generated by microprocessor 120 that reaches antenna 110 and the television receiver. In addition, microprocessor 120 and componentry ancillary thereto are encased by a schematically indicated tin shield 192 for blocking electromagnetic interference.

Mode switch 124 is connected to microprocessor 120 via an EMI reduction inductor 194 and grounded capacitors 196 and 198. Another switch 200, provided for turning microprocessor 120 to an add/erase mode, is coupled to the microprocessor via an EMI reduction inductor 202 and grounded capacitors 204 and 206. Switch 200 facilitates the modification of the user-implemented programming of microprocessor 120 to incorporate new channels or to remove old ones.

An initialization circuit 208 is connected to microprocessor 120 for resetting an internal microprocessor timer (not shown) when the unit is powered up. Initialization circuit 208 includes a capacitor 210, a resistor 212 and a diode 214.

LED drivers 134 (FIGS. 5 and 6) comprise eight transistors 216 having respective bases (not labeled) tied to microprocessor 120 and respective emitters (not designated) tied to respective LED segments 138 of display 142 via resistors 218. Each transistor 216 is provided at its base with a resistor 220 which functions to pull, to a high logic level, the high impedance output of an output resistor (not shown) internal to microprocessor 120. LED drivers 136 similarly comprise eight transistors 222 each having a base (not designated) connected to microprocessor 120 via a respective current limiting resistor 224 paired with a resistor 226 for asserting a logic high when a signal is present. Each transistor 222 has an emitter (not referenced) linked to a respective LED segment 140 of display 142 via a respective resistor 228.

Switch drivers 146 (FIGS. 5 and 6) comprise a first set of five transistors 230 with input terminals (bases) connected to microprocessor 120 via respective current limiting resistors 232. Switch drivers 146 further comprise a second set of five transistors 234 with base terminals connected to microprocessor 120 via respective current limiting resistors 236. Diode switches 148 comprise a first set of diodes 238 each associated with a respective driver transistor 230 and additionally comprise a second set of diodes 240 each associated with a respective driver transistor 234. Inductors 150 include two sets of inductors 242 and 244. As described hereinabove, each inductor 242 of the first set is paired with a respective inductor 244 of the second set having a common inductance which is different from the inductances of all the other inductors 242 and 244.

Each diode 238 is connected at an anode side to dipole arm 112 of antenna 110 via a capacitor 246 and a respective inductor 242 and to an output terminal of a respective driver transistor 230 via a resistor 248. Similarly, each diode 240 is connected at an anode side to dipole arm 114 of antenna 110 via a capacitor 250 and a respective inductor 244 and to an output terminal of a respective driver transistor 234 via a resistor 252. Driver transistors 230 and 234 have additional terminals connected to 5-volt supply 251 and to a grounded capacitor 253.

Diode switches 148 include two diodes 254 and 256 which are connected to respective dipole arms 112 and 114 via capacitors 258 and 260 only (no inductors or zero inductance). Capacitors 246, 250, 258, and 260 serve to block transmission of d-c current from any one diode 238, 240, 254, 256 to any other diodes of switches 148. Resistors 248 and 252 set the amount of d-c current flowing through the respective diodes 238, 240, 254, 256 in the conduction states thereof.

At most, only one pair of diodes 238, 240, 254, 256 is in conduction at any one time, the conducting diodes being associated with a matching pair of inductors 242 and 244. When a diode 238, 240, 254, 256 is provided with a forward d-c current, then it presents a low impedance to any alternating current. Conversely, when a driver transistor 230 or 234 acts in response to a signal from microprocessor 120 to turn off the flow of d-c current through the associated diode 238, 240, 254, or 256, then that diode blocks alternating current from the respective dipole arm 112 or 114.

Whether any one diode pair is in conduction is determined by microprocessor 120 in accordance with the channel selection encoded in the wireless remote control signal 118 sensed by detector 116. The conduction states of diodes 238 and 240 determine which pair of matching inductors 242 and 244, if any, are conducting current from to antenna dipole arms 112 and 114 for purposes of tuning the dipole arms for an optimal impedance match over a frequency range corresponding to a selected television channel.

The cathodes of diodes 238 and 254 are connected to coils 262 and 264 of a balun transformer 266, while the cathodes of diodes 240 and 256 are coupled to another coil 268 of transformer 266. Coils 264 and 268 are electrically opposed to one another (180° out of phase). Inductor component 262 is connected at an output end to an input of preamplifier 152 via a capacitor 270. Transformer 264 is a ferrite device, preferably with an impedance ratio of 1:1, as discussed above with reference to prior art. Transformer 264 serves to convert a balanced input signal to an unbalanced output signal.

Current limiting resistors 232 and 236 at the bases of driver transistors 230 and 234 are connected to microprocessor 120 via EMI reduction inductors 272. Resistors 232 and 236 and, hence, associated driver transistors 230 and 234, are connected in pairs to output terminals of microprocessor 120. The connection pairs correspond to pairs of matching inductors 242 and 244. Pull-up resistors 274 and EMI reduction capacitor capacitors 276 and 278 are also provided.

Preamplifier 152 is connected to coaxial cable 154 via a capacitor 280 and to variable voltage regulator 162 (FIGS. 5 and 6) via a resistor 282 and a ferrite bead inductor 284. A grounded capacitor 286 is connected to ferrite bead inductor 284.

Gain control 158 of variable voltage regulator 156 (FIGS. 5 and 6) comprises resistors 288, 290, 292 and a capacitor 294. Fixed voltage regulator 162 is connected to an ancillary circuit 296 including capacitors 298, a resistor 300 and a power indicator 302. Circuit 296 is connected to microprocessor 120 via an EMI reduction inductor 304 and to five-volt source 306. A dual terminal connector 308 is provided for an off-board connection to a d-c adaptor (not shown.)

Figure 7:
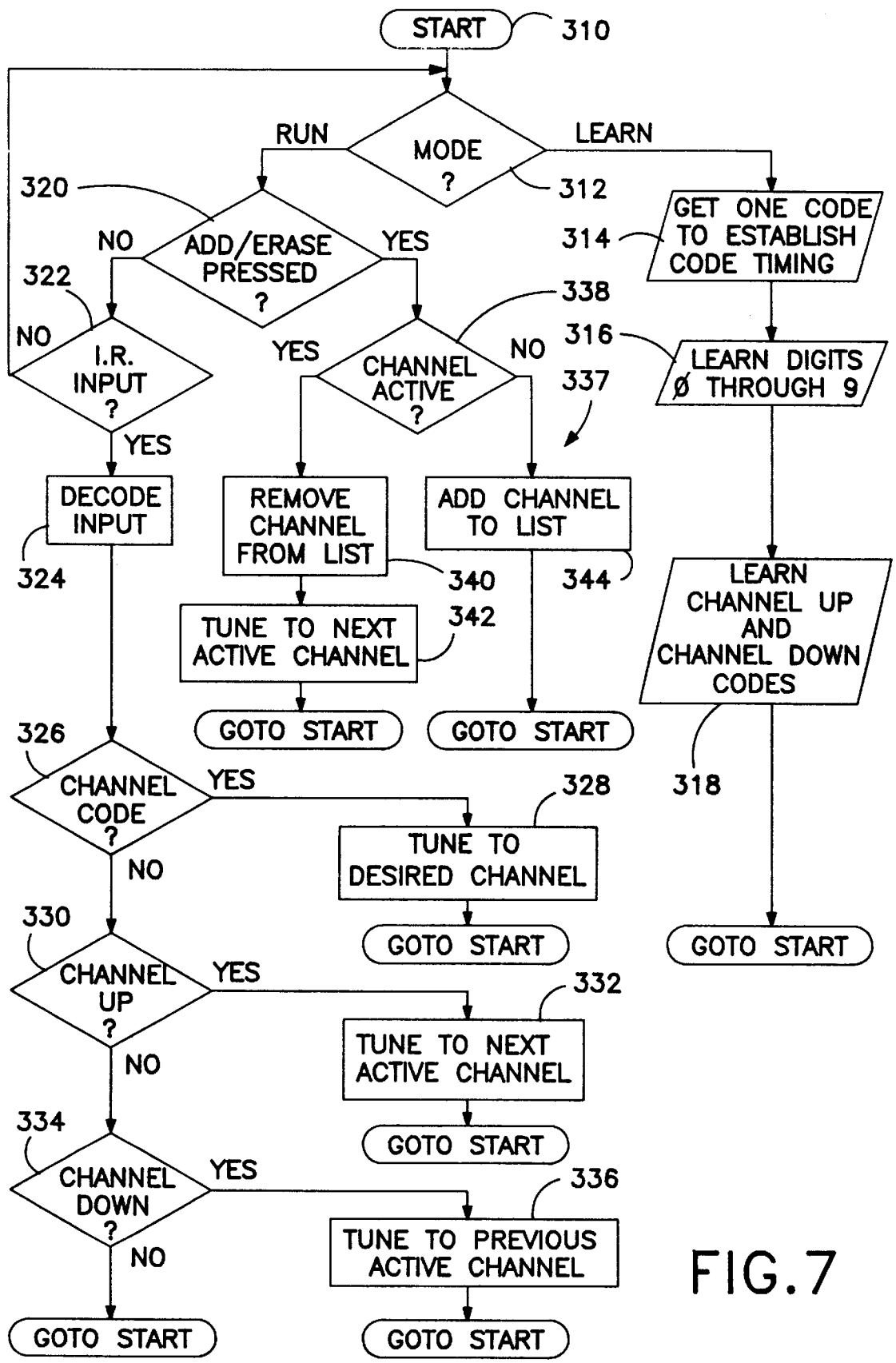
FIG. 7 is a flow chart diagram illustrating steps and routines in the operation of a microprocessor shown in FIGS. 5 and 6.

As depicted in FIG. 7, upon processor startup 310, microprocessor 120 initially inquires at 312 as to the status of run/learn switch 124 (FIGS. 5 and 6), i.e., as whether the microprocessor is to operate in a normal "run" mode or a "learn" mode. Upon entering the learn mode, microprocessor 120 first analyzes a test signal from the remote control unit in a routine 314 to determine the code timing or format of the signals generated by the particular brand of remote control unit to be utilized. This analysis or determination of code timing or signal format is described in detail hereinafter with reference to FIG. 9.

Upon determining code timing or signal format of the remote control unit, microprocessor 120 learns, in routines 316 and 318, the particular codes for the digits 0 through 9 and the codes for channel incrementing and channel decrementing. Routines 316 and 318 are described in detail hereinafter with reference to FIGS. 8A and 8B. Upon completion of routines 316 and 318, microprocessor 120 returns to startup 310 and to inquiry 312.

Upon determining at inquiry 312 that the channel change codes have been learned, microprocessor 120 inquires at decision junction 320 whether switch 200 is activated, thereby indicating that a television channel is to be added or removed from a list of channels memorized by the microprocessor. Generally, switch 200 must be activated by the user upon installation of the antenna optimalization device of FIGS. 5 and 6.

If switch 200 is not activated, microprocessor 120 investigates at an inquiry 322 whether detector 116 has sensed a wireless remote control signal (generally infrared). If there is no remote control signal, microprocessor 120 returns to inquiry 312. If, on the other hand, a remote control signal is present, microprocessor 120 decodes the signal in a step 324, basically by determining the sequence of intervals between successive pulses in the infrared control signal. Each interpulse interval will be either of a long or a short duration.

Upon decoding the infrared control signal at step 324, microprocessor 120 inquires at 326 whether the decoded signal represents a digit code. This inquiry 326 basically comprises a comparison of the decoded sequence of long and short intervals with the digit codes learned by the microprocessor in routine 316. Upon determining the desired channel, microprocessor 120 tunes the antenna 110 (FIG. 5) to that channel in a step 328 by issuing appropriate signals to driver transistors 230 and 234 (FIG. 6). Microprocessor 120 then returns to startup 310 and inquiry 312.

If the decoded infrared control signal does not represent a channel code, i.e., if the comparison with the memorized channel codes yields a negative result, microprocessor 120 inquires at 330 whether the decoded signal represents a command to increment the channel selection. If this inquiry has an affirmative result, microprocessor 120 issues signals in a step 332 to driver transistors 230 and 234 for tuning antenna dipole arms 112 and 114 to the next higher active television channel. At that point, microprocessor 120 returns to startup 310 and inquiry 312.

If the decoded infrared control signal represents neither a channel code or a command to increment the channel selection, microprocessor 120 inquires at 334 whether the decoded signal represents a command to decrement the channel selection. If so, microprocessor 120 generates signals in a step 336 to driver transistors 230 and 234 for tuning antenna dipole arms 112 and 114 to the next lower active television channel. Subsequently, microprocessor 120 returns to startup 310 and inquiry 312.

If switch 200 is activated, as determined by microprocessor 120 at decision junction 320, the microprocessor proceeds to a subroutine 337 for updating the list of active channels. This list is important for implementing the channel incrementing and decrementing commands. If, on the one hand, a channel is active, as determined by microprocessor 120 at a decision junction 338, the microprocessor removes that channel from the memorized channel list in a step 340 and then tunes antenna 110 to the next active channel in a step 342. If, on the other hand, a channel is inactive, as determined by microprocessor 120 at a decision junction 342, the microprocessor adds that channel to the memorized channel list in a step 342.

Figure 8A:
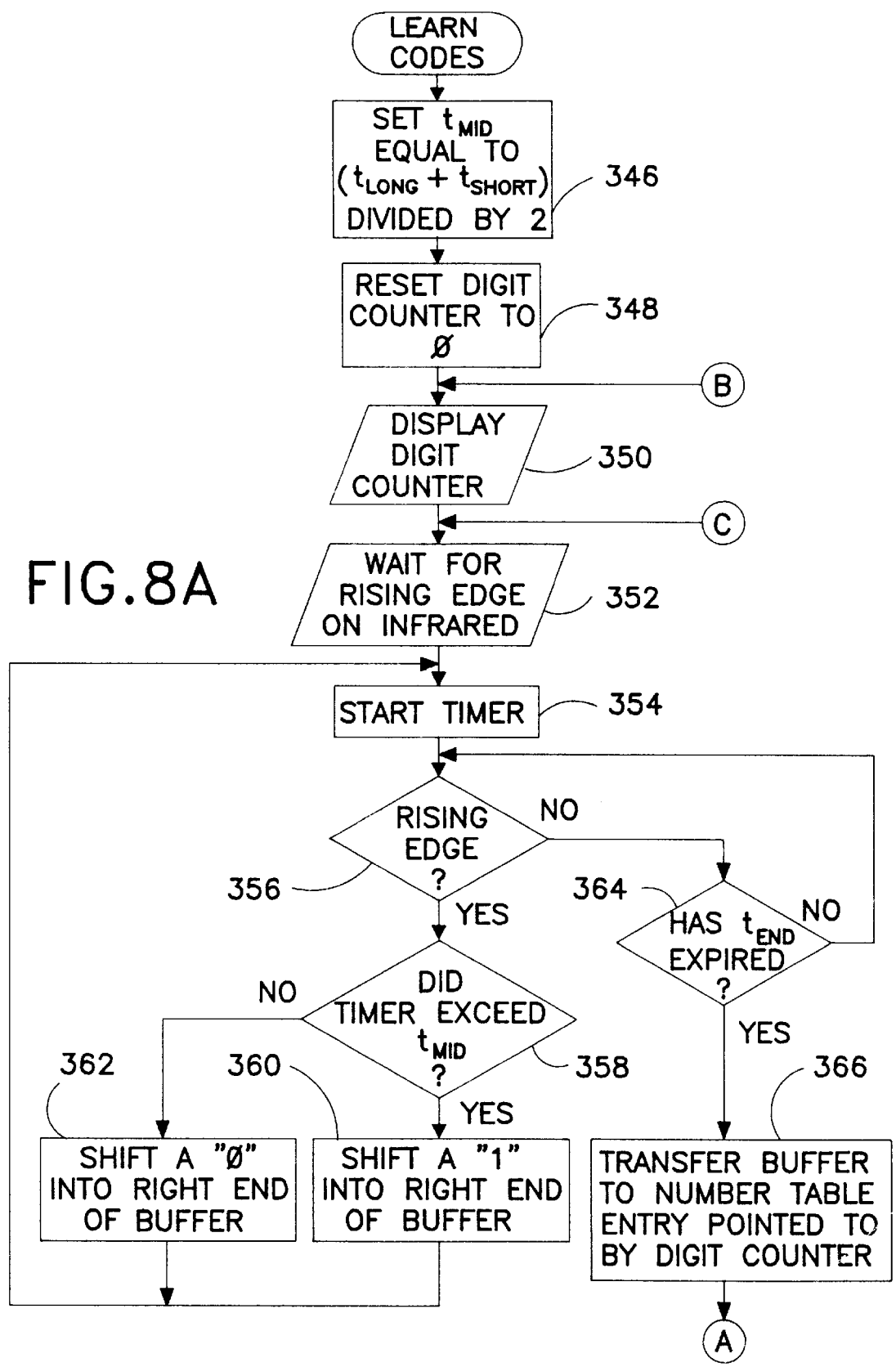
FIGS. 8A and 8B are a flow chart diagram depicting steps in a routine to learn digit codes and channel increment and decrement codes of a remote control unit, in accordance with the present invention.
Figure 8B:
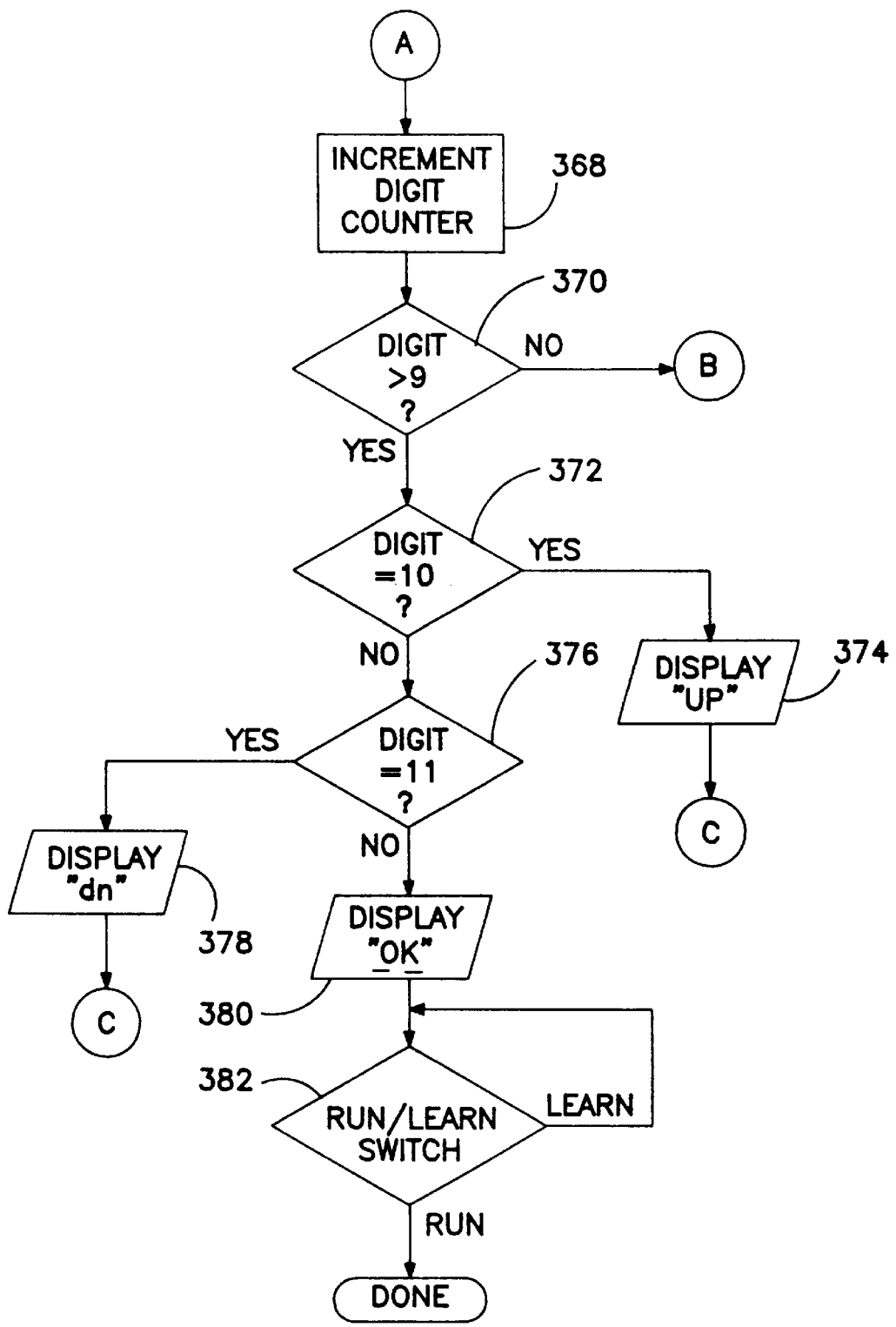

As illustrated in FIGS. 8A and 8B, the learning of digit codes and channel up and down codes (routines 316 and 318) begins by forming an average $t_{mid}$, in a step 346, of the long and short interpulse intervals $t_{long}$ and $t_{short}$ as determined in routine 314 (FIGS. 7 and 9). In a step 348, microprocessor 120 then resets an internal channel counter to zero. Subsequently, in a step 350, microprocessor 120 transmits signals to transistors 216 and 222 (FIG. 6) for showing the contents of the internal channel counter on display 142. In a step 352, microprocessor 120 monitors the output of detector 116 and, upon detecting a rising edge of an incoming infrared control signal, starts an internal timer (not shown) in a step 354. Upon detecting at a decision junction 356 a subsequent rising edge of the incoming infrared control signal, microprocessor 120 investigates at a query 358 whether the time between successive pulses of the incoming infrared signal exceeds the average interpulse interval or duration $t_{mid}$. If the time between successive pulses of the incoming infrared signal exceeds the average interpulse interval or duration $t_{mid}$, microprocessor 120 enters a "1," i.e., a high logic level, into an input end of an internal buffer register in a step 360. If, on the contrary, the time between successive pulses of the incoming infrared signal is less that the average interpulse interval or duration $t_{mid}$, microprocessor 120 enters a "0," i.e., a low logic level, into the input end of the internal buffer register in a step 362. Microprocessor 120 restarts the internal timer in step 354.

If at decision junction 356 microprocessor 120 fails to detect a rising edge of an incoming infrared control signal, the microprocessor checks in an inquiry 364 whether the time from the last detected rising edge exceeds a preestablished maximum period $t_{end}$. Period $t_{end}$ is equal to, say, three times the long interpulse interval $t_{long}$ and represents the termination of a coded message (e.g., a digit) from the monitored remote control unit. Period $t_{end}$ may be set by microprocessor 120 during the execution of routine 314 (FIG. 7). If the time since the last detected rising edge has not yet exceeded period $t_{end}$, microprocessor 120 returns to decision junction 356 to await either a new rising edge or the counting of period $t_{end}$ by the internal timer. Upon the expiration of period $t_{end}$ since the last pulse of an incoming infrared remote control signal, microprocessor 120 transfers, in a step 366, the binary sequence stored in the internal buffer register to an internal number table at an address specified by the digit counter (step 348).

Upon the completion of transfer step 366, microprocessor 120 increments the internal digit counter in a step 368 (FIG. 8B) and then checks at a decision junction 370 whether the contents of the digit counter is greater than 9. If the digit is less than 9, i.e., if not all digits 0 through 9 have been decoded, microprocessor 120 returns to step 350 wherein the new digit is displayed. This display of the new digit operates as a stimulus to the user to actuate the appropriate button or key of the remote control unit and transmit an infrared remote control signal corresponding to the displayed digit to the detector 116.

If the digit in the microprocessor's internal digit counter is greater than 9, as determined by the microprocessor at decision junction 370, microprocessor 120 engages in another inquiry at a decision junction 372 to determine whether the counter's contents are equal to 10. If so, microprocessor 120 energizes appropriate transistors 216 and 222 to produce the word "UP" on display 142 in a step 374 and proceeds to step 352 to decode an incoming infrared signal corresponding to the channel incrementation selection.

If the digit in the microprocessor's internal digit counter is greater than 9, as determined by the microprocessor at decision junction 370, and not equal to 10, as determined by the microprocessor at decision junction 372, microprocessor 120 checks in an inquiry 376 whether the counter's contents are equal to 11. If so, microprocessor 120 transmits signals to transistors 216 and 222 to produce the designation "DN" on display 142 in a step 378 and proceeds to step 352 to decode an incoming infrared signal corresponding to the channel decrementation selection. If not, microprocessor 120 generates a termination message such as "OK" on display 142 in a step 380 and enters an inquiry 382 to await the change of switch 124 from the learn mode position to the run mode position.

FIG. 9 depicts pulses of a wireless remote control signal sensed by detector 116 and communicated to microprocessor 120. Each known infrared remote control unit on the market generates signals in which the command information is encoded by a pulse position modulation scheme wherein logic highs and lows are encoded by time intervals of either a long duration $t_{long}$ or a short duration $t_{short}$ between successive pulses 384. The remote control signals have a preamble 386 substantially longer in duration than the fixed length of the pulses 384. In addition, each remote command is separated from succeeding commands by termination period $t_{end}$.

FIG. 10 illustrates steps in the routine 314 for analyzing a test signal from a remote control unit to determine the code timing or format of the signals generated by the particular brand of remote control unit to be utilized. More particularly, routine 314 determines the magnitudes of interpulse intervals $t_{long}$ and $t_{short}$.

In an initialization step 388, which may occur in part upon first activation of the optimalization circuit, microprocessor 120 sets initial values of zero, infinity, and 30 msec for interpulse intervals $t_{long}$ and $t_{short}$ and termination period $t_{end}$, respectively. Microprocessor 120 may also set display 142 to indicate to a user that an arbitrary button or key of the wireless remote control unit should be pressed to transmit a test signal to detector 116. Such an indication may, for example, be the word "GO." Upon initialization, microprocessor 120 checks in an inquiry 390 whether a rising edge has occurred. If so, the microprocessor increments a pulse counter and checks the contents of the counter in another inquiry 392 to determine whether five pulses have arrived in the incoming test signal. If fewer than five pulses have arrived, microprocessor 120 returns to inquiry 390 to await another pulse.

If microprocessor 120 determines at inquiry 392 that five pulses have arrived in the test signal, microprocessor determines the interval between the last rising edge and the immediately preceding rising edge in a step 394. This determination may be implemented, for example, by checking the contents of a time counter which is reset by the microprocessor after a determination at 392 that 5 pulses have not yet arrived.

In an inquiry 396, microprocessor 120 checks whether the measured interpulse time interval between the fourth and the fifth pulses is greater than the stored value of $t_{long}$. If so, microprocessor 120 stores the newly measured interpulse interval as $t_{long}$ in a step 398. If not, microprocessor 120 queries at 400 whether the newly measured interpulse interval is smaller than $t_{short}$. If the newly measured interpulse interval is indeed smaller than $t_{short}$, that measurement is stored as $t_{short}$ in a step 402. After the completion of step 398 or 402 or upon a negative determination in query 400, microprocessor 120 returns to inquiry 390.

If no rising edge has occurred, as determined by microprocessor 120 at inquiry 390, the microprocessor 120 checks, in an inquiry 404, the time which has elapsed since the last rising pulse edge. If this time is greater than the stored value of $t_{end}$, microprocessor 120 resets $t_{end}$ as three times the value of $t_{long}$ in a step 406 and terminates routine 314.

It is clear from the foregoing description that microprocessor 120 utilizes an adaptive timing technique to learn the digital code associated with each button on a remote control unit. Microprocessor 120 ignores the first five pulses of a test signal in determining format or timing codes in routine 314 because of extant remote control units which use a series of short pulses as a preamble. Thus, it is ensured that no false data is acquired during the determining of format or timing codes in routine 314.

Although the invention has been described in terms of particular embodiments and applications, one of ordinary skill in the art, in light of this teaching, can generate additional embodiments and modifications without departing from the spirit of or exceeding the scope of the claimed invention. It is to be noted, for example, that the antenna tuning elements may be designed for use in receiving FM or other radio signals. Accordingly, it is to be understood that the drawings and descriptions herein are preferred by way of example to facilitate comprehension of the invention and should not be construed to limit the scope thereof.

What is claimed is:

1. A device for optimizing antenna operation, comprising:
   detector means for detecting a wireless control signal generated by a remote control unit in response to user manipulation and encoding a broadcast channel or station selected by a user;
   processing means operatively connected to said detector means for analyzing said wireless control signal during a learning operation to learn a coding format of said wireless control signal, including timing characteristics and digit signal codes, thereby enabling adaptation of the device to wireless remote control units of different manufacturers, and for analyzing said wireless control signal during a normal use operation to determine a broadcast channel or station selected by a user;
   tuning means operatively connectable to an antenna for tuning the antenna, said tuning means including a plurality of pairs of first and second inductors, the first inductor and the second inductor of each pair of inductors having a common inductance, the first and second inductors of each pair differing in inductance from the first and second inductors of other pairs, all of said first inductors being connected on one side to one another and all of said second inductors being connected on one side to one another; and
   control means operatively connected to said processing means and to said tuning means for controlling said tuning means, in response to signals from said processing means, to modify said tuning means depending on a channel or station selection encoded in said wireless control signal, said control means including a plurality of switching circuits operatively connected to said processing means and to respective ones of said first and said second inductors.

2. The device defined in claim 1 wherein said switching circuits each include a transistor driving a diode switch connected in series to a respective one of said first and said second inductors, said processing means being connected at an output to said transistor.

3. The device defined in claim 1, further comprising display means operatively connected to said processing means for displaying a designation of said channel or station selection in response to signals from said processing means.

4. The device defined in claim 1 wherein said processing means has a plurality of terminals, further comprising means operatively connected to said terminals for reducing electromagnetic interference generated by said processing means.

5. The device defined in claim 1, further comprising a housing substantially surrounding said processing means for shielding said antenna from electromagnetic interference generated by said processing means.

6. The device defined in claim 1 wherein said control means includes a plurality of transistors driving a respective diode switches each connected in series to a respective one of said first and said second inductors.

7. The device defined in claim 1, further comprising display means operatively connected to said processing means for displaying, in response to signals therefrom, a designation of said channel or station selection in response to signals from said processing means.

8. The device defined in claim 1 wherein said detector means includes an infrared sensor.

9. The device defined in claim 1 wherein said processing means includes a microprocessor programmed to determine the coding format of said wireless control signal and to analyze said wireless control signal during said normal use operation to determine a broadcast channel or station selected by the user.

10. A device for optimizing antenna operation, comprising:
    a wireless control signal detector for detecting a wireless control signal generated by a remote control unit in response to user manipulation and encoding a broadcast channel or station selected by a user;
    a microprocessor operatively connected to said detector, said microprocessor being programmed to analyze said wireless control signal during a learning operation to learn a coding format of said wireless control signal, including timing characteristics and digit signal codes, thereby enabling adaptation of the device to wireless remote control units of different manufacturers, and to analyze said wireless control signal during a normal use operation to determine a broadcast channel or station selected by a user;
    a plurality of tuning elements operatively connectable to an antenna for tuning the antenna; and
    a plurality of switching circuits operatively connected to said tuning elements and to said microprocessor, said switching circuits being operable to selectively couple said tuning elements to the antenna, in response to signals from said microprocessor, thereby optimizing signal reception by the antenna for a channel or station selection encoded in said wireless control signal.

11. The device defined in claim 10 wherein said switching circuits each include a transistor driving a diode switch connected in series to a respective one of said tuning elements, said microprocessor being connected at an output to said transistor.

12. The device defined in claim 10, further comprising a display operatively connected to said microprocessor for displaying a designation of said channel or station selection in response to signals from said microprocessor.

13. The device defined in claim 10 wherein said microprocessor has a plurality of terminals, further comprising filter elements operatively connected to said terminals for reducing electromagnetic interference generated by said microprocessor.

14. A device for optimizing antenna operation, comprising:
    a wireless control signal detector for detecting a wireless control signal generated by a remote control unit in response to user manipulation and encoding a broadcast channel or station selected by a user;
    processing means operatively connected to said detector for analyzing said wireless control signal to determine the broadcast channel or station selected by the user;
    a plurality of tuning elements different from signal extraction circuitry of a signal receiver and operatively connectable to an antenna for tuning the antenna for an optimal impedance match over a plurality of different frequency ranges; and
    a plurality of switching circuits operatively connected to said tuning elements and to said processing means, said switching circuits being operable to selectively couple said tuning elements to the antenna, in response to signals from said processing means, thereby optimizing signal reception by the antenna for a channel or station selection encoded in a wireless control signal sensed by said detector.

15. The device defined in claim 14, further comprising means connected to said processing means for inducing said processing means to analyze said wireless control signal during a learning operation to determine a coding format of said wireless control signal.

16. The device defined in claim 14 wherein said switching circuits each include a transistor driving a diode switch connected in series to a respective one of said tuning elements, said processing means being connected at an output to said transistor.

17. The device defined in claim 14, further comprising a display operatively connected to said processing means for displaying a designation of said channel or station selection in response to signals from said microprocessor.

18. The device defined in claim 14 wherein said processing means has a plurality of terminals, further comprising filter elements operatively connected to said terminals for reducing electromagnetic interference generated by said microprocessor.

19. A method for facilitating optimal reception of a desired broadcasting station or channel, comprising:

providing a receiver, an antenna connected thereto and tuning elements connectable to said antenna for tuning said antenna for an optimal impedance match over a plurality of different frequency ranges;

also providing a wireless remote control unit;

operating said wireless remote control unit to generate a wireless control signal encoding a broadcast channel or station selected by a user;

in response to the generation of said wireless control signal, automatically operating said receiver to tune said receiver to a selected channel or station encoded by said wireless control signal; and also in response to the generation of said wireless control signal, automatically and selectively coupling said tuning elements to said antenna to optimize an impedance match over a frequency range corresponding to said selected channel or station, the selective coupling of said tuning elements to said antenna being separate and different from the operating of said receiver.

20. The method defined in claim 19, further comprising operating a microprocessor to determine a coding format of said wireless control signal.

21. The method defined in claim 20 further comprising reducing electromagnetic interference generated by said microprocessor.

22. The method defined in claim 19 wherein said tuning elements are selectively coupled to said antenna by selectively activating transistor switching circuits.

23. The method defined in claim 19, further comprising automatically displaying a designation of a channel or station to which said antenna is tuned.

\* \* \* \* \*